United States Patent [19]

Kieferle et al.

[11] 4,288,306
[45] Sep. 8, 1981

[54] PROCESS FOR FORMING A METAL OR ALLOY LAYER AND DEVICE FOR EXECUTING SAME

[76] Inventors: Wolfgang Kieferle, Lindenstrasse 23, D 7981 Grünkraut; Franz Wäschle, Brucknerstrasse 16, D 7987 Weingarten, both of Fed. Rep. of Germany

[21] Appl. No.: 56,121

[22] Filed: Jul. 9, 1979

[30] Foreign Application Priority Data

Jul. 8, 1978 [DE] Fed. Rep. of Germany ....... 2830134

[51] Int. Cl.³ .................... C23C 11/02; C23C 15/00
[52] U.S. Cl. .................. 204/192 R; 204/298; 427/37; 427/39
[58] Field of Search ........... 204/192 P, 192 C, 192 D, 204/192 S, 192 R, 298; 427/37, 39; 118/715, 719; 250/531

[56] References Cited

U.S. PATENT DOCUMENTS

| | | | |
|---|---|---|---|
| 3,709,809 | 1/1973 | Wright et al. | 204/192 C |
| 3,795,783 | 3/1974 | Plumat et al. | 204/192 R |
| 3,930,975 | 1/1976 | Siegle et al. | 204/192 C |
| 3,985,635 | 10/1976 | Adam et al. | 204/192 R X |
| 4,046,660 | 9/1977 | Fraser | 204/192 C |
| 4,046,712 | 9/1977 | Cairns et al. | 204/298 X |
| 4,125,446 | 11/1978 | Hartsough et al. | 204/192 C X |

*Primary Examiner*—Arthur Prescott
*Attorney, Agent, or Firm*—Gerald Levy

[57] ABSTRACT

A process for depositing a metal or alloy layer on an electrically conductive work piece by means of a glow discharge. The work piece is inserted as one electrode of an electric field in a low-pressure chamber charged with a preionized carrier gas and coating material or spender medium. An arc discharge is utilized for explosively spattering the spender medium.

4 Claims, 6 Drawing Figures

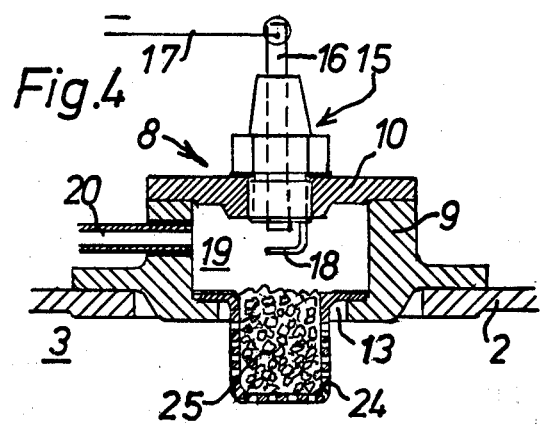
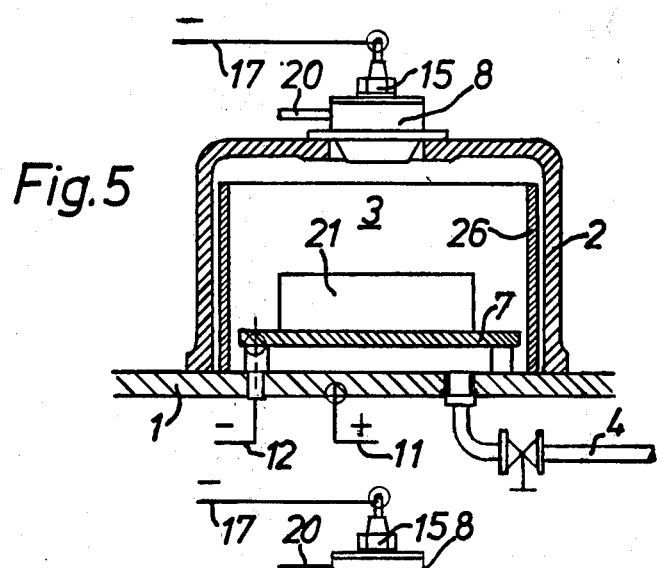
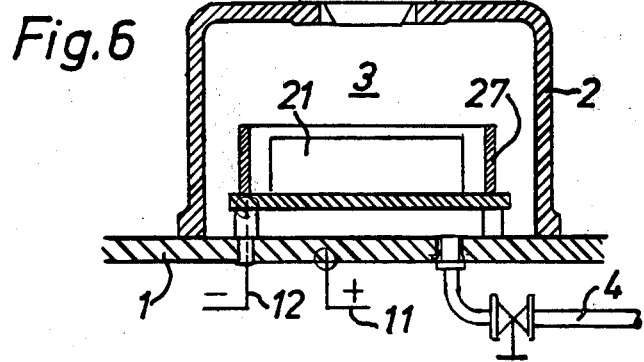

PROCESS FOR FORMING A METAL OR ALLOY LAYER AND DEVICE FOR EXECUTING SAME

BACKGROUND OF THE INVENTION

The invention relates to a process for forming a metal or alloy layer on an electrically-conducting work piece by means of a glow discharge, where the work piece is connected as one electrode of an electric field in a low-pressure chamber loaded with carrier gas, whereby the carrier gas and the material to be coated or spender medium are preionized and are transported in ionized state into the electric field of the low-pressure chamber, as well as a device for the execution of same.

The work pieces to which such a layer is to be applied were hitherto subjected for this purpose to a galvanic bath containing acids or caustic solutions for various treatment times.

This galvanizing process presents the disadvantage that it will give rise to an environmental problem of increasingly greater scope due to the acids or caustic solutions required. Very high investment costs are at least necessary to neutralize the resulting waste waters, provided the pertinent authorities do not forbid the construction of such plants in advance.

High waste-water deliveries result because of the elevated salt load of the neutralized waste waters. To be sure, processes have already been disclosed in which formation of a metal layer on an electricity-conducting work piece takes place by means of a glow discharge, whereby the work piece is connected as one electrode of an electric field in a low-pressure chamber loaded with carrier gas, whereas the other electrode consists of the coating metal. These techniques were not found to be very suitable, as they only make the coating of wires or smaller work pieces possible and, because of the low energy of the impact ions, only with extremely thin and not very adherent layers.

For the sake of completeness of presentation, the so-called gas-plating technique is also mentioned, in which the metal used to form the layer is deposited onto the work piece from a gas containing a suitable metal compound or which consists of same, but the work piece must be highly heated for the purpose. Such high temperatures (temperatures of 1,200° C. or more are involved) impair the physical properties of the work pieces, so that application of the gas-plating technique is very limited.

The task arose of developing a process and a device capable of avoiding the above mentioned disadvantages of the known processes of this type, i.e., which is not harmful to the environment and is also suitable for the production of thick layers on larger work pieces, whereby heating of work pieces up to temperatures injurious to them is avoided.

SUMMARY OF THE INVENTION

The solution was surprisingly found in a further development of the technics mentioned in the second group, in which an arc discharge is utilized for the explosive spattering of coating material or spender medium with the aid of a carrier gas put into turbulence, and this arc discharge is superposed on a glow discharge, and energy is additionally imparted to the preionized metal ions of the spender medium connected as one electrode by making use of the cathode fall of potential, to form a layer or deposit of these metal ions at a high rate on the work piece connected as the other electrode.

An article of flat shape made of an alloy highly resistant to ionization, preferably the inside wall surface of the low-pressure chamber, can be used as an electrode of the electric field. On the other hand, however, flat surfaces made from the coating metal itself placed in the low-pressure chamber can also be used as second or additional electrodes.

In the execution of the process, it is advantageous to first put the carrier gas into turbulence and to flow over the surface of the spender medium on its way to the low-pressure chamber, there splitting off electrons and ionizing.

It is also advantageous to preionize the metal particles spattered from the spender medium by the carrier gas by means of said carrier gas.

To apply an alloy layer, it was found suitable to preionize carrier gas and the alloy components by ion producers individually assigned to the alloy components in all cases. Another no less suitable possibility for applying an alloy layer consists in introducing additional electrodes made of various coating metals.

A variant form of execution provides for using other and not preionized metal ions of the spender medium for applying the layer and utilizing the preionized metal ions of the spender medium for applying a primary layer, on which thereafter at least one layer of not preionized metal ions of the spender medium is applied.

A device suitable for the execution of this process includes an ion producer consisting of a turbulence chamber which can be loaded with the carrier gas, a device for forming an arc in the turbulence chamber, and means for contact between the carrier gas and the coating metal; a low pressure chamber and an opening between the turbulence chamber and the low-pressure chamber.

One electrode of the electric field is preferably of flat shape made from an alloy highly resistant to ionization, preferably the inside wall surface of the low-pressure chamber.

A variant form of execution provides for a flat surface made from the spender medium to be set up in the low-pressure chamber as second or additional electrodes, and an ion producer is individually assigned to each alloy component for applying an alloy layer, or additional electrodes consisting of different spender media are provided to apply an alloy layer.

The ion producer located before the low-pressure chamber consists of a turbulence chamber capable of being loaded with carrier gas, a spark plug for forming an arc in the turbulence chamber, and means for contact between the carrier gas and the coating metal.

It is also possible to provide for introduction of a perforated sheet of spender medium into the opening from the turbulence chamber to the low-pressure chamber, or to provide the walls of the turbulence chamber with a spender-medium lining, or a screenlike perforated basin into which the spender medium is introduced as a granulate is inserted into the opening between the turbulence chamber and low-pressure chamber.

Other advantageous or suitable forms of execution and details of the device involved can be seen from the patent claims and the following detailed description.

BRIEF DESCRIPTION OF THE DRAWINGS

The pertinent drawings presented as examples schematically represent the following:

FIG. 4: A similar section through a third form of execution of an ion producer; and FIGS. 5 and 6 represent further execution variants of the device in accordance with FIG. 1.

DETAILED DESCRIPTION OF A PREFERRED EMBODIMENT

Figure 1:
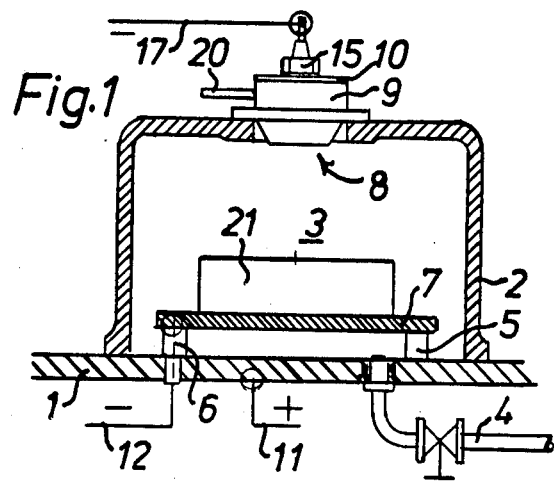
FIG. 1: A device in accordance with the invention in section.

Hood 2 for forming low-pressure chamber 3 is set gastight on electrically-conducting insulated plate 1 according to FIG. 1. Pipe 4, which is passed insulated through plate 1, is attached to this low-pressure chamber 3 and serves for its evacuation in a known way. Work-piece support 7 is carried on plate 1 by rod insulators 5 and 6. Hood 2 has an opening in its cover into which ion producer 8 is introduced. Plate 1 and with it hood 2 as well as housing 9 of the ion producer and its cover 10 can be connected to the positive pole of a source of current which is not represented by line 11. Work-piece support 7 is attached to the negative pole of the source of current by line 12, which is passed through support insulator 6. Plate 1 and hood 2, as well as work piece support 7, are prepared from an alloy highly resistant to ion release.

Figure 2:
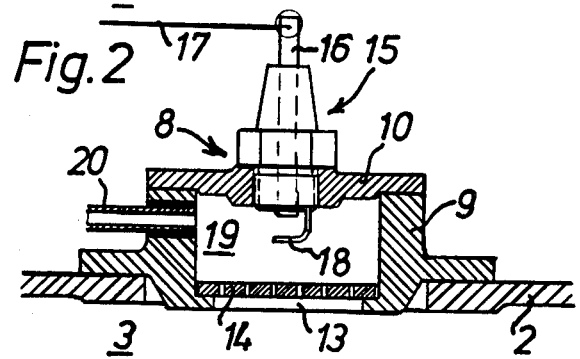
FIG. 2: A section through a form of execution of the ion producer on a greater scale.

In the example of a form of execution of an ion producer 8 represented in FIG. 2, opening 13 directed to low-pressure chamber 3 is provided, into which, for example, perforated sheet 14 made of coating material (spender medium) is placed. Spark plug 15, for example, is screwed in cover 10, and its middle electrode 16 is connected to the negative pole of the source of current mentioned through line 17.

Counter electrode 18 can be connected to the positive pole of the source of current to cover 10, housing 9, hood 2, and plate 1. Insulated connecting piece 20 for feeding the carrier gas insulated from the housing opens into the turbulence chamber 19 surrounded by housing 9 and cover 10. It is also possible to design several connecting pieces, and the discharge can be directed radially or tangentially.

Finally, means not expressely described and illustrated here of known type are also provided for regulating the tension or voltage and to adjust the pressure in the low-pressure chamber and keep it constant, according to the most favorable working conditions.

Work piece 21 to be coated with the spender medium (see FIG. 1) is placed on work-piece support 7, hood 2 is placed onto plate 1, and the thus closed low-pressure chamber 3 is evacuated through pipe 4. The carrier gas (e.g., argon) is then introduced through connecting piece or pieces 20, and plate 1, hood 2, etc. are put into plus tension, for example. An electric field accordingly is formed between plate 1 and hood 2 as the anode, on the one hand, and work piece 21 connected as the cathode, on the other. In addition, an arc forms between counter electrode 18 and center electrode 16 of spark plug 15.

The carrier gas entering into turbulence chamber 19 is ionized by this arc and is changed into a turbulent current. The gas ions penetrate through perforated sheet 14 made of spender medium and spatter metal ions from it, which reach the electric field in low-pressure chamber 3 as a sort of "ion rain." They are turned in low-pressure chamber 3 in the direction of work piece 21 and strike against it there in the course of the glow discharge between anode 1, 2 and cathode 21 at a very high rate, so that in part they penetrate into the surface of work piece 21, and as a result an extremely adherent metal layer is formed on work piece 21. The thickness of the layer is thereby essentially determined by the duration of the coating process.

With respect to the electric connection, it might also be possible to consider grounding the plus pole of the source of current and line 11 connected to plate 1, wherein the connection between work-piece support 7 and center electrode 16 of spark plug 15 with the minus pole would produce the source of current for the coating process. Plate 1 and hood 2 then would not conduct voltage, and insulation of the opening of pipe 4 and connecting piece 20 could be omitted.

Figure 3:
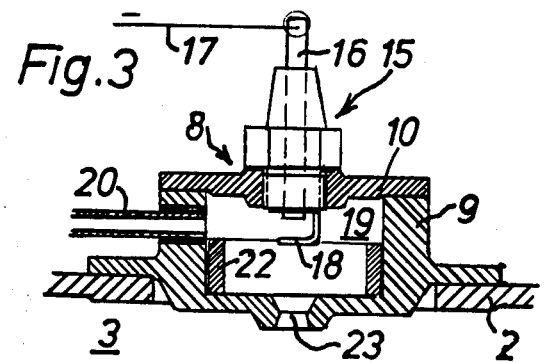
FIG. 3: A similar section through a second form of execution of an ion producer.

The form of execution of the ion producer of FIG. 3 differs from that of FIG. 2 only by the arrangement of the spender medium, which is placed into housing 9 as ring lining 22, and the somewhat different contoured opening 23 leading to low-pressure chamber 3. In the form of execution of FIG. 4, a screenlike perforated basin 24 is introduced into opening 13 to low-pressure chamber 3, which takes up the spender medium in the form of a granulate.

The variant of the device in accordance with the invention shown in FIG. 5 uses, in addition to ion producer 8, an anode of spender medium, here, for example, set up as hollow cylinder 26 within hood 2 on plate 1 and which encloses work piece 21. In the further variant after FIG. 6, an additional cathode of spender medium is set up in the form of ring 27, which surrounds work piece 21, on work-piece support 7.

The use of additional electrodes can be intended to reinforce the coating effect, especially if greater layer thicknesses are to be achieved. However, it is also possible to proceed by using ion producer 8 only at the outset to produce a first adherent primary layer, after which the further coating takes place in a usual way by means of additional electrodes 26 or 27.

Finally, it is also possible to provide for several ion producers 8 which are supplied with different spender media in order to achieve an alloy-like coating of work piece 21. It is also possible to achieve this result if the additional electrodes 26 or 27 mentioned consist of different spender media.

The turbulence is purposely produced directly below ion producer 8 in accordance with the invention to utilize the cathode fall of potential in turbulence chamber 19 by producing turbulence by the arc developing between electrodes 15 and 18 in the carrier gas which is blown into this turbulence chamber 19 through connecting piece 20 in the immediate vicinity of ion producer 8, among others.

In the case of the object of the invention, it is advantageous for the electric field to stand vertically on the surface of the work piece to be coated because of the the cathode fall of potential; the work piece can be connected as cathode or anode. In contrast to those hitherto known, three-dimensional coatings accordingly become possible.

The electric flow purposely acts in the direction of the cathode, where further energy is imparted to the ionized metal ions due to the cathode drop in potential, so that they can strike the cathode at a higher rate and enter into an intimate union with its material. Coatings of, for example, heavily stressed layer surfaces with coatings of about several millimeters or more are accordingly possible. It is also possible to coat or deposit alloys in this way. The process proposed in accordance with the invention entails a considerable improvement in grade because the metal ions of the coating material are applied between and later also on the electrons of the surface of the work piece.

In consideration of the fact that no turbulences exist or they are short-lived in a vacuum, a suitable so-called turbulence chamber 19 must be provided, which stands in a determined relation to the carrier gas blown in through connecting piece 20, i.e., its flow rate. In order to better understand the course of the process, it will be briefly described below. The course is as follows:

(a) an arc discharge serves for an explosive spattering of spender media with the aid of the carrier gas;
(b) this arc discharge is superimposed on a glow discharge, which finally takes over the coating or depositing as well as the transporting of the spattered ions in the direction of the work piece to be coated.

EXAMPLE

Coating with copper:
Underlying material: Steel ST 37
Features of the process:

The parts to be coated are introduced into the receivers and connected as cathodes. Following evacuation of the receiver in the range between 0.1 to 0.3 mb, the current is switched on.

A suitable transport gas ($N_2H_2$ in this case) is now blown through the spender medium, which is encased in the dome of the receiver, into the unit, and the required transport means necessary to be able to deposit the loosened metal particles or metal ions on the parts of the work piece surface to be coated are accordingly obtained. Due to a constant circulation between the spattering parts and those to be coated as well as the coating of newly arriving ions, a reciprocal ion exchange takes place, which leads to the desired coating.

Technical data: spender medium copper
Underlying material: steel
Transport medium: $N_2H_2$
Vacuum: 0.1 to 0.2 mb
Temperature: 150° C., measured on the cathode side
Treatment time: 2 hours
Result: A material coating 3 mm thick was applied in 2 hours under these conditions.

I claim:

1. A process for coating a metal or alloy layer on an electricity-conducting work piece by means of a glow discharge, wherein the work piece is connected as one electrode of an electric field in a low-pressure chamber loaded with carrier gas and the material to be coated or spender medium is connected as the other electrode, wherein the carrier gas and the spender medium are preionized and are transferred into the electric field of the low-pressure chamber in ionized state, characterized by the fact that an arc discharge is utilized for the explosive spattering of spender medium with the aid of a carrier gas put into turbulence, and this arc discharge is superposed on a glow discharge, and energy is additionally imparted to the preionized metal ions of the spender medium by making use of the cathode fall of potential, and these metal ions of high velocity are coated or deposited on the work piece connected as the first electrode.

2. The process in accordance with claim 1 characterized by the fact that the carrier gas is first put into turbulence and is caused to flow over the surface of the spender medium on its way to the low pressure chamber where electrons are detached and ionized.

3. Process in accordance with claims 1 or 2, characterized by the fact that the metal particles of the spender medium spattered by the carrier gas are preionized by the carrier gas.

4. Process in accordance with claim 1, characterized by the fact that further not preionized metal ions of the spender medium are used for coating the layer, and the preionized metal ions of the spender medium are used for coating a primary layer onto which after that at least one layer of not preionized metal ions of the spender medium is deposited.

* * * * *